(12) United States Patent
Kuo

(10) Patent No.: US 7,358,790 B2
(45) Date of Patent: Apr. 15, 2008

(54) HIGH PERFORMANCE LEVEL SHIFT CIRCUIT WITH LOW INPUT VOLTAGE

(75) Inventor: Mao-Hsiung Kuo, Tainan County (TW)

(73) Assignee: Himax Technologies Limited (TW)

( * ) Notice: Subject to any disclaimer, the term of this patent is extended or adjusted under 35 U.S.C. 154(b) by 0 days.

(21) Appl. No.: 11/356,707

(22) Filed: Feb. 17, 2006

(65) Prior Publication Data

US 2007/0194830 A1    Aug. 23, 2007

(51) Int. Cl.
*H03L 5/00* (2006.01)
(52) U.S. Cl. .................. 327/333; 326/81; 365/189.11
(58) Field of Classification Search ............... 327/333, 327/52, 55; 365/189.11; 326/80, 81
See application file for complete search history.

(56) References Cited

U.S. PATENT DOCUMENTS 5,933,043 A * 8/1999 Utsunomiya et al. ....... 327/333
6,177,824 B1 * 1/2001 Amanai ...................... 327/333
6,249,145 B1 * 6/2001 Tanaka et al. ................ 326/68
6,300,796 B1   10/2001 Troutman et al. ............. 326/81
6,510,089 B2    1/2003 Taura et al. ........... 365/189.11
2001/0008381 A1 * 7/2001 Sakai et al. ................. 327/333
2004/0169542 A1 * 9/2004 Kouzuma .................... 327/333
2005/0285659 A1 * 12/2005 Kanno et al. ............... 327/333

* cited by examiner

Primary Examiner—Tuan T. Lam
Assistant Examiner—Patrick O'Neill
(74) Attorney, Agent, or Firm—Hayes Soloway P.C.

(57) ABSTRACT

A level shift circuit adds two NMOS transistors or two PMOS transistors between the NMOS transistors and PMOS transistors at the VP-side and the VN-side and connects the gates of the added transistors to the two output terminals. By this architecture, the level shift circuit of the present invention can successfully convert a small input voltage into a large output voltage with less DC current and/or without any additional bandgap circuit.

6 Claims, 6 Drawing Sheets

HIGH PERFORMANCE LEVEL SHIFT CIRCUIT WITH LOW INPUT VOLTAGE

BACKGROUND

1. Field of Invention

The present invention relates to a logic circuit having at least one output signal in response to at least two input signals. More particularly, the present invention relates to a level shift circuit having complimentary low-voltage input signals and complimentary high-voltage output signals.

2. Description of Related Art

Level shift circuits are utilized in integrated circuits for changing the voltage of a signal from a first voltage to a second voltage.

FIG. 1A is a circuit diagram of a prior art level shift circuit 100a. Complimentary input signals "INA" and "INB" are supplied to the voltage-level shift circuit 100a and converted into output signals "OUTA" and "OUTB", respectively, each having a potential VP higher than the high level of the corresponding signal "INA" or "INB". The voltage-level shift circuit 100a consists of NMOS transistors N1 and N2, provided at the VN-side, that receive the input signals "INA" and "INB", respectively, and PMOS transistors P1 and P2 provided at the VP-side. The PMOS transistors P1 and P2 constitute a connection in which the gate and drains are cross-connected for positive feedback to shift the high-level potential of the input signals "INA" and "INB" from a lower potential (e.g. VCC) to the higher potential VP.

FIG. 1B is a circuit diagram of another prior art level shift circuit 100b. Complimentary input signals "INA" and "INB" are supplied to the voltage-level shift circuit 100b and converted into output signals "OUTA" and "OUTB", respectively, each having a potential VN lower than the low level of the corresponding input signal "INA" or "INB". The voltage-level shift circuit 100b consists of PMOS transistors P3 and P4, provided at the high-level VP-side, that receive the input signals "INA" and "INB", respectively, and NMOS transistors N3 and N4 provided at the low-level VN-side. The NMOS transistors N3 and N4 constitute a connection in which the gate and drains are cross-connected to shift the low-level potential of the input signals "INA" and "INB" from a higher potential (e.g. VSS) to the lower potential VN.

However, the above-mentioned conventional level shift circuits cannot easily obtain a large output voltage when the input voltage is too small, for example, when converting the input voltage (VDD=2V) into the output voltage (VEE=−20V). Unless an additional bandgap circuit is used to meet the requirements, an unexpected DC current is generated along with the output voltage.

SUMMARY

It is therefore an aspect of the present invention to provide a level shift circuit, which can convert a small input voltage into a large output voltage with little to no DC current and omit the additional bandgap circuit as well.

According to one preferred embodiment of the present invention, the level shift circuit has a first first-conductive-type transistor; a second first-conductive-type transistor; a first second-conductive-type transistor; a second second-conductive-type transistor; a third second-conductive-type transistor; and a fourth second-conductive-type transistor. Either of the first conductive-type transistor and the second conductive-type transistor is a p-type transistor while the other is an n-type transistor.

The first first-conductive-type transistor has a source connected to a first potential, a gate connected to a first input terminal, and a drain connected to a first output terminal. The second first-conductive-type transistor has a source connected to the first potential, a gate connected to a second input terminal, and a drain connected to a second output terminal. The first second-conductive-type transistor has a drain and a gate connected to the first output terminal, and the second second-conductive-type transistor has a drain and a gate connected to the second output terminal. The third second-conductive-type transistor has a drain connected to a source of the first second-conductive-type transistor, a gate connected to the second output terminal, and a source connected to a second potential. The fourth second-conductive-type transistor has a drain connected to a source of the second second-conductive-type transistor, a gate connected to the first output terminal, and a source connected to the second potential.

In one aspect, the level shift circuit has a first power supply terminal, a second power supply terminal, a first PMOS transistor, a second PMOS transistor, a first NMOS transistor, a second NMOS transistor, a third NMOS transistor and a fourth NMOS transistor. A first potential is supplied to the first power supply terminal, a second potential is supplied to the second power supply terminal, and the second potential is lower than the first potential.

The first PMOS transistor has a source connected to the first power supply terminal, a gate connected to a first input terminal, and a drain connected to a first output terminal. The second PMOS transistor has a source connected to the first power supply terminal, a gate connected to a second input terminal, and a drain connected to a second output terminal. The first NMOS transistor has a drain and a gate connected to the first output terminal. The second NMOS transistor has a drain and a gate connected to the second output terminal.

The third NMOS transistor has a drain connected to a source of the first NMOS transistor, a gate connected to the second output terminal, and a source connected to the second power supply terminal. The fourth NMOS transistor has a drain connected to a source of the second NMOS transistor, a gate connected to the first output terminal, and a source connected to the second power supply terminal.

In another aspect, the level shift circuit has a first power supply terminal, a second power supply terminal, a first NMOS transistor, a second NMOS transistor, a first PMOS transistor, a second PMOS transistor, a third PMOS transistor and a fourth PMOS transistor. A first potential is supplied to the first power supply terminal, a second potential is supplied to the second power supply is terminal, and the first potential is lower than the second potential.

The first NMOS transistor has a source connected to the first power supply terminal, a gate connected to a first input terminal, and a drain connected to a first output terminal. The second NMOS transistor has a source connected to the first power supply terminal, a gate connected to a second input terminal, and a drain connected to a second output terminal. The first PMOS transistor has a drain and a gate connected to the first output terminal. The second PMOS transistor has a drain and a gate connected to the second output terminal.

The third PMOS transistor has a drain connected to a source of the first PMOS transistor, a gate connected to the second output terminal, and a source connected to the second power supply terminal. The fourth PMOS transistor has a drain connected to a source of the second PMOS transistor, a gate connected to the first output terminal, and a source connected to the second power supply terminal.

It is to be understood that both the foregoing general description and the following detailed description are examples and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
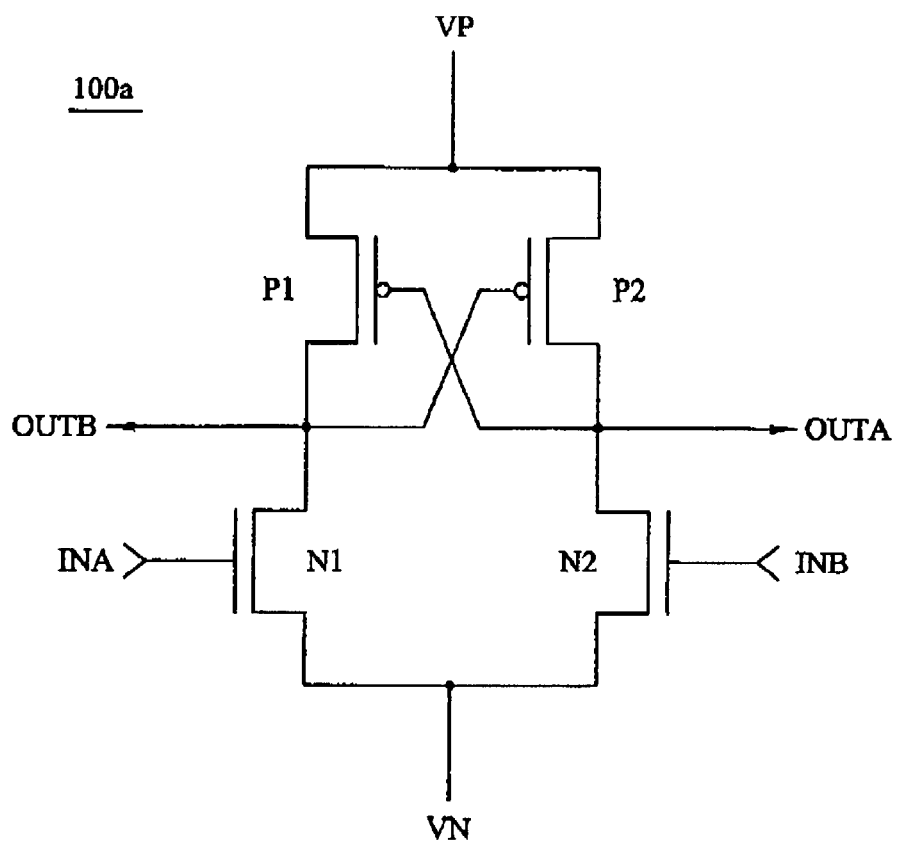
FIG. 1A is a circuit diagram of a prior art level shift circuit.
Figure 1B:
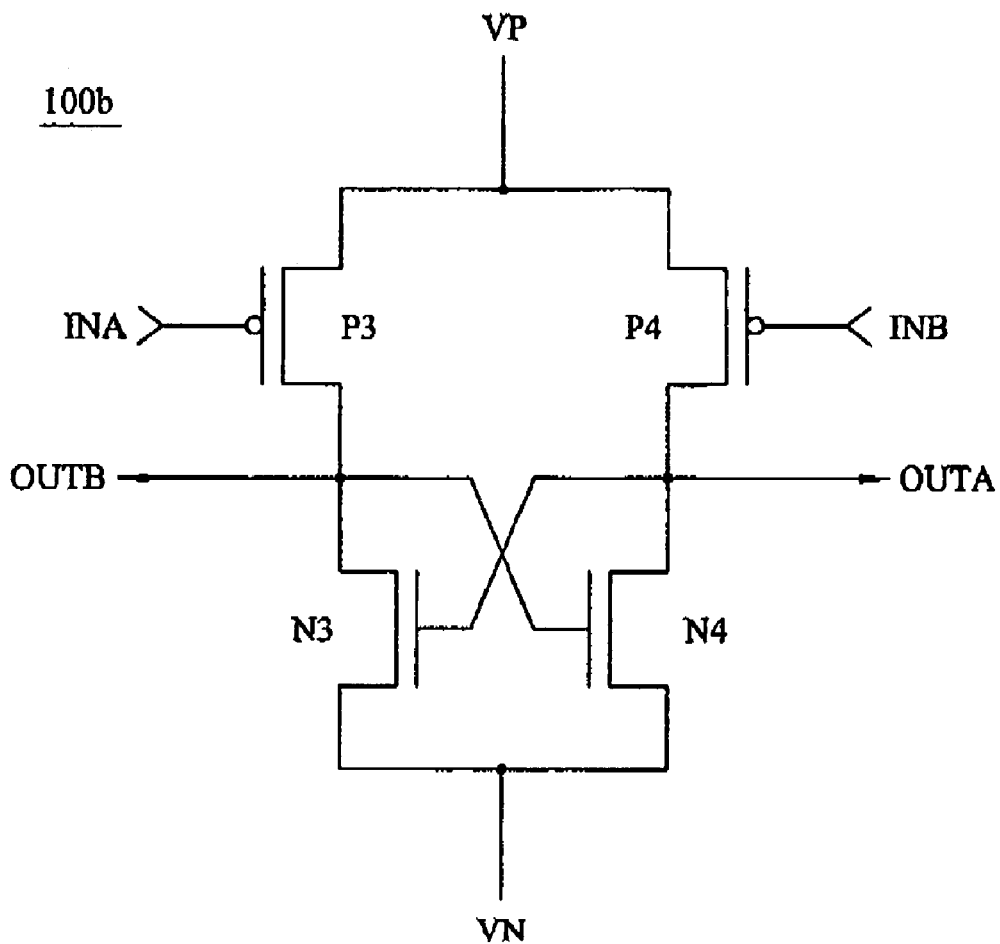
FIG. 1B is a circuit diagram of another prior art level shift circuit.

Reference will now be made in detail to the preferred embodiments of the present invention, examples of which are illustrated in the accompanying drawings. Wherever possible, the same reference numbers are used in the drawings and the description to refer to the same or like parts.

The present invention adds two NMOS transistors or two PMOS transistors between the NMOS transistors and PMOS transistor at the VP-side and the VN-side and connects the gates of the added transistors to the two output terminals. By this architecture, the level shift circuit of the present invention can successfully convert a small input voltage into a large output voltage with less DC current and/or without any additional bandgap circuit.

Figure 2A:
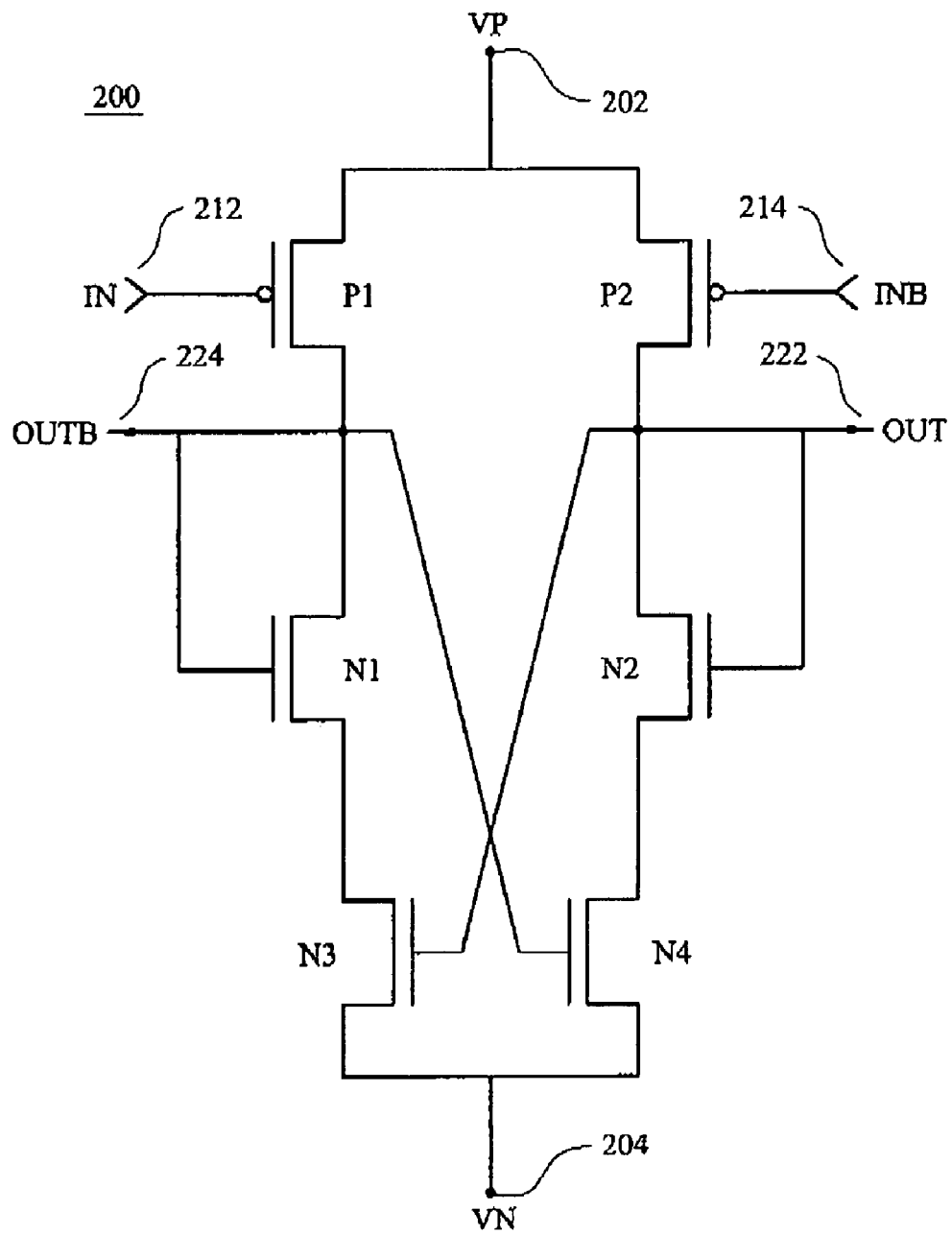
FIG. 2A is a circuit diagram of one preferred embodiment of the present invention.

FIG. 2A is a circuit diagram of one preferred embodiment of the present invention. A level shift circuit 200 has a first power supply terminal 202, a second power supply terminal 204, a first PMOS transistor P1, a second PMOS transistor P2, a first NMOS transistor N1, a second NMOS transistor N2, a third NMOS transistor N3 and a fourth NMOS transistor N4. A first potential VP is supplied to the first power supply terminal 202, a second potential VN is supplied to the second power supply terminal 204, and the second potential VN (e.g. −20V) is lower than the first potential VP (e.g. 2V).

The first PMOS transistor P1 has a source connected to the first power supply terminal 202, a gate connected to a first input terminal 212, and a drain connected to a first output terminal 224. The second PMOS transistor P2 has a source connected to the first power supply terminal 202, a gate connected to a second input terminal 214, and a drain connected to a second output terminal 222. The first NMOS transistor N1 has a drain and a gate connected to the first output terminal 224. The second NMOS transistor N2 has a drain and a gate connected to the second output terminal 222.

The third NMOS transistor N3 has a drain connected to a source of the first NMOS transistor N1, a gate connected to the second output terminal 222, and a source connected to the second power supply terminal 204. The fourth NMOS transistor N4 has a drain connected to a source of the second NMOS transistor N2, a gate connected to the first output terminal 224, and a source connected to the second power supply terminal 204.

More particularly, the first input terminal 212 is arranged to input a first input signal (IN), the second input terminal 214 is arranged to input a second input signal (INB). The second input signal (INB) is an inverted signal of the first input signal (IN). The first output terminal 224 is arranged to output a first output signal (OUTB), the second output terminal 222 is arranged to output a second output signal (OUT). The second output signal (OUT) is an inverted signal of the first output signal (OUTB).

An operation of the level shift circuit 200 is disclosed as follows. The level shift circuit 200 is assumed to be in a stable state with input signals "IN" at the high level and "INB" at the low level. In this stable state, the PMOS transistors P1 and P2 are turned off and on, respectively, and the NMOS transistors N3 is turned on while the NMOS transistors N4 is turned off; thus OUT=VP and OUTB=VN at the output terminals 222 and 224, respectively.

Next, the input signals "IN" and "INB" are assumed to be shifted to the low level and the high level, respectively. The PMOS transistors P1 and P2 are then turned on and off, respectively. A voltage increase at the output terminal 224 is supplied to the gate of the NMOS transistor N4, whereas a voltage decrease at the output terminal 222 is supplied to the gate of the NMOS transistor N3. The NMOS transistors N3 and N4 are thus turned off and on, respectively.

The transition of the NMOS transistors N3 and N4 from on to off and off to on, respectively, achieves a feedback operation to stimulate voltage shift at the output terminals 222 and 224 in which the output signals OUT and OUTB gradually become VN and VP, respectively.

Figure 2B:
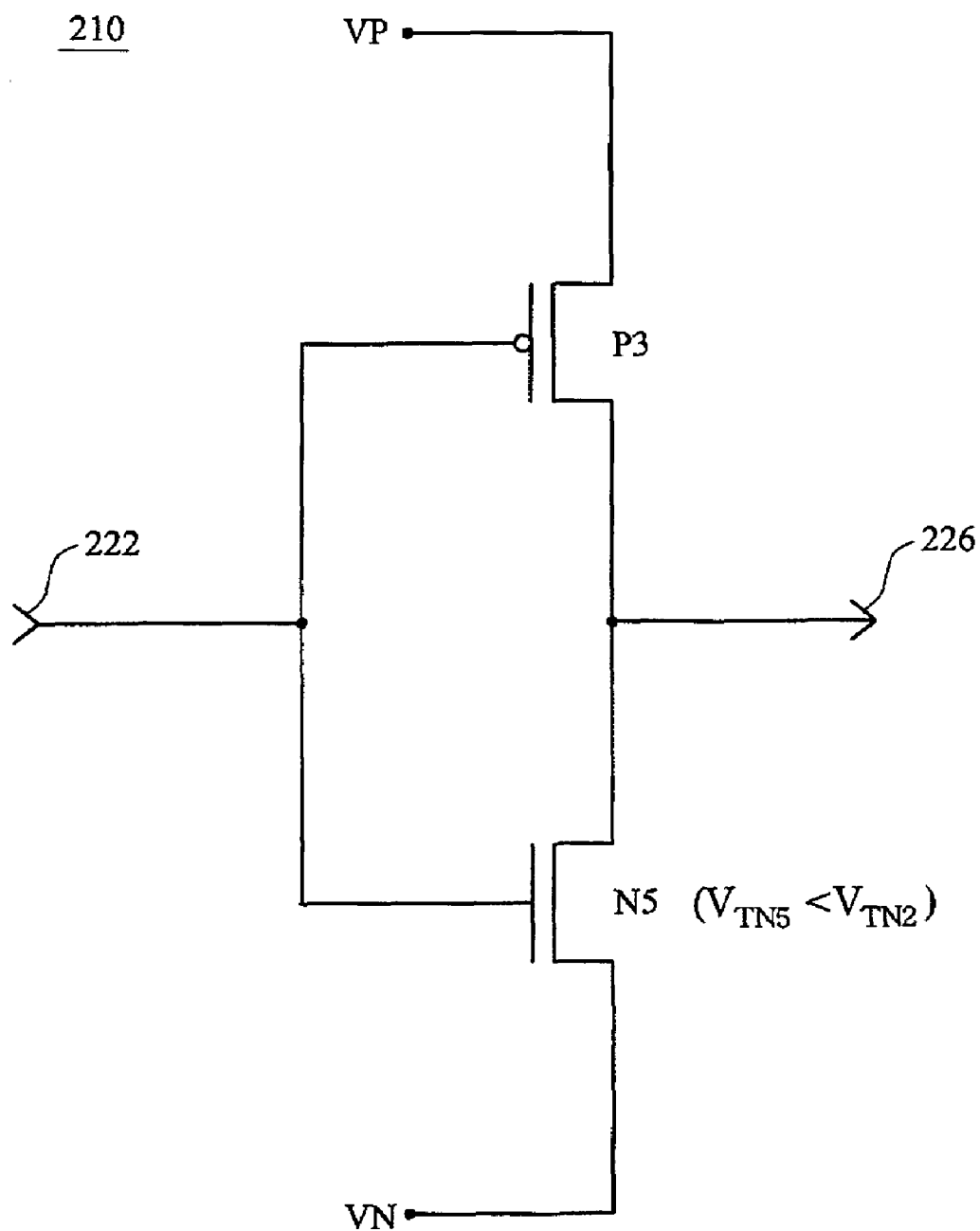
FIG. 2B is a circuit diagram of the next stage circuit in the preferred embodiment as illustrated in FIG. 2A.

The level shift circuit 200 preferably has a next stage circuit 210 for further preventing current leakage. FIG. 2B is a circuit diagram of the next stage circuit 210 in the preferred embodiment. The next stage circuit 210 has a third PMOS transistor P3 and a fifth NMOS transistor N5. The third PMOS transistor P3 has a source connected to the first potential VP, a gate connected to the second output terminal 222, and a drain connected to a third output terminal 226. The fifth NMOS transistor N5 has a source connected to the second potential VN, a gate connected to the second output terminal 222, and a drain connected to the third output terminal 226.

More precisely, a threshold voltage ($V_{TN5}$) of the fifth NMOS transistor N5 is less than a threshold voltage ($V_{TN2}$) of the second NMOS transistor N2. In particular, the amplitude of the output signal OUT is equal to the sum of the second potential VN and the threshold voltage $V_{TN2}$ of the second NMOS transistor N2, i.e. VN+$V_{TN2}$. Therefore, considering the source of the fifth NMOS transistor connected to the second potential VN, the threshold voltage $V_{TN5}$ being less than the threshold voltage $V_{TN2}$ can ensure the fifth NMOS transistor can be successfully turned on by the output voltage VN+$V_{TN2}$, thereby preventing the leakage current.

Figure 3A:
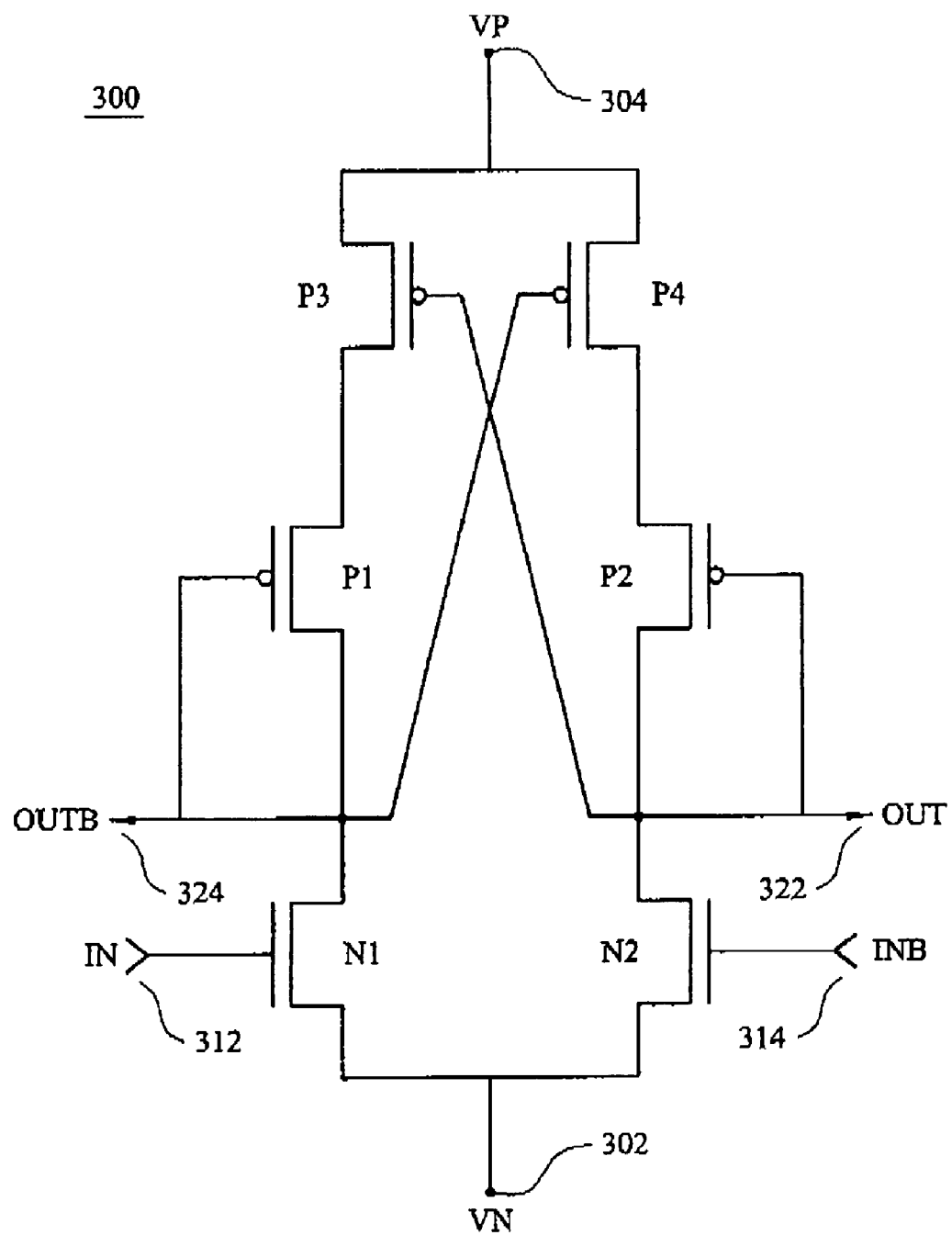
FIG. 3A is a circuit diagram of another preferred embodiment of the present invention.

FIG. 3A is a circuit diagram of another preferred embodiment of the present invention. A level shift circuit 300 has a first power supply terminal 302, a second power supply terminal 304, a first NMOS transistor N1, a second NMOS transistor N2, a first PMOS transistor P1, a second PMOS transistor P2, a third PMOS transistor P3 and a fourth PMOS transistor P4. A first potential VN is supplied to the first power supply terminal 302, a second potential VP is supplied to the second power supply terminal 304, and the first potential VN is lower than the second potential VP.

The first NMOS transistor N1 has a source connected to the first power supply terminal 302, a gate connected to a first input terminal 312, and a drain connected to a first output terminal 324. The second NMOS transistor N2 has a source connected to the first power supply terminal 302, a gate connected to a second input terminal 314, and a drain connected to a second output terminal 322. The first PMOS transistor P1 has a drain and a gate connected to the first output terminal 324. The second PMOS transistor P2 has a drain and a gate connected to the second output terminal 322.

The third PMOS transistor P3 has a drain connected to a source of the first PMOS transistor P1, a gate connected to the second output terminal 322, and a source connected to the second power supply terminal 304. The fourth PMOS transistor P4 has a drain connected to a source of the second PMOS transistor P2, a gate connected to the first output terminal 324, and a source connected to the second power supply terminal 304.

More particularly, the first input terminal 312 is arranged to input a first input signal (IN), the second input terminal 314 is arranged to input a second input signal (INB). The second input signal (INB) is an inverted signal of the first input signal (IN). The first output terminal 324 is arranged to output a first output signal (OUTB), and the second output terminal 322 is arranged to output a second output signal (OUT). The second output signal (OUT) is an inverted signal of the first output signal (OUTB).

An operation of the level shift circuit 300 is disclosed as follows. The level shift circuit 300 is assumed to be in a stable state with input signals "IN" at the low level and "INB" at the high level. In this stable state, the NMOS transistors N1 and N2 are turned off and on, respectively, and the PMOS transistors P3 is turned on while the PMOS transistors P4 is turned off; thus OUT=VN and OUTB=VP at the output terminals 322 and 324, respectively.

Next, the input signals "IN" and "INB" are assumed to be shifted to the high level and the low level, respectively. The NMOS transistors N1 and N2 are then turned on and off, respectively. A voltage decrease at the output terminal 324 is supplied to the gate of the PMOS transistor P4, whereas a voltage increase at the output terminal 322 is supplied to the gate of the PMOS transistor P3. The PMOS transistors P3 and P4 are thus turned off and on, respectively.

The transition of the PMOS transistors P3 and P4 from on to off and off to on, respectively, achieves a feedback operation to stimulate voltage shift at the output terminals 322 and 324, in which the output signals OUT and OUTB gradually become VP and VN, respectively.

Figure 3B:
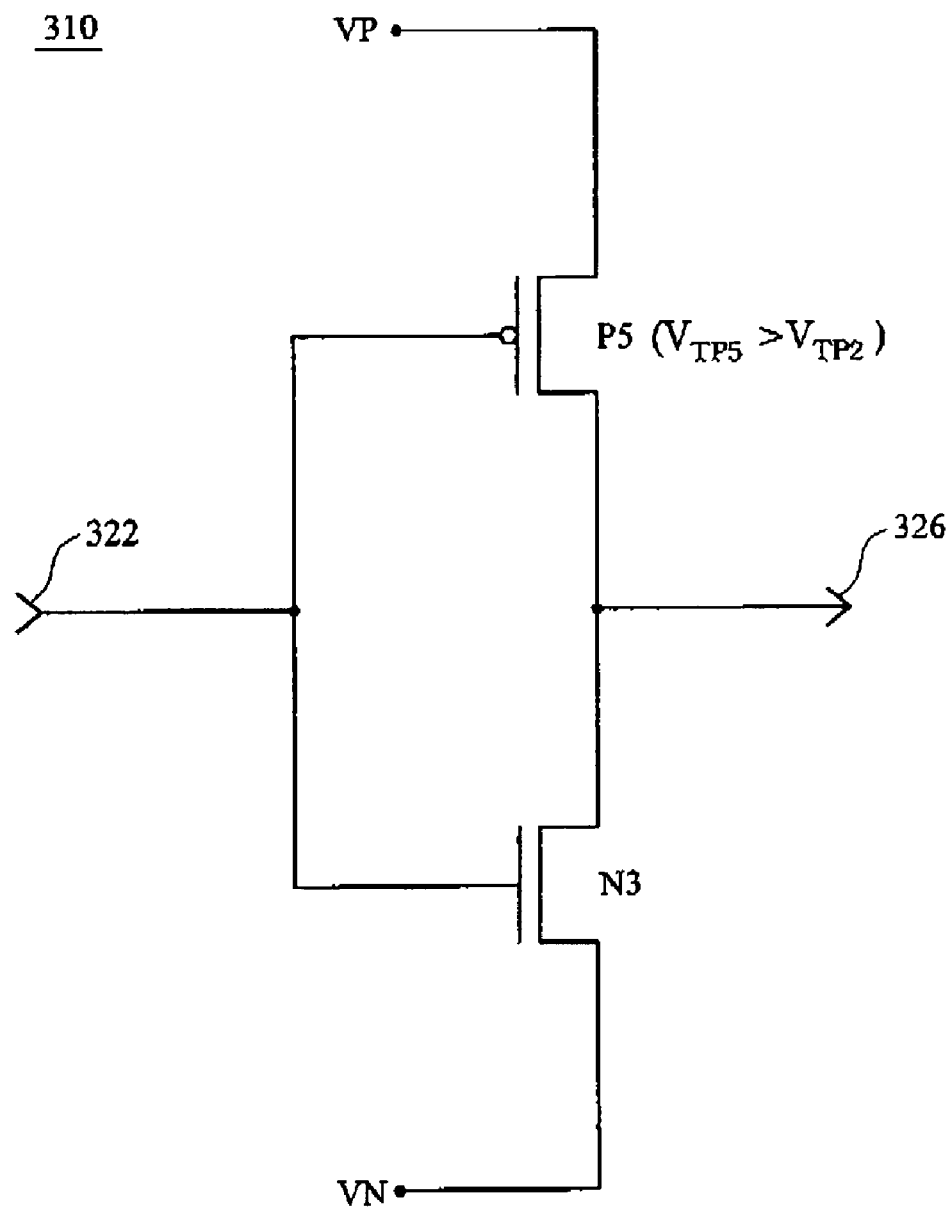
FIG. 3B is a circuit diagram of the next stage circuit in the preferred embodiment as illustrated in FIG. 3A.

The level shift circuit 300 preferably has a next stage circuit 310 for further preventing current leakage. FIG. 3B is a circuit diagram of the next stage circuit 310 in the preferred embodiment. The next stage circuit 310 has a fifth PMOS transistor P5 and a third NMOS transistor N3. The fifth PMOS transistor P5 has a source connected to the second potential VP, a gate connected to the second output terminal 322, and a drain connected to a third output terminal 326. The third NMOS transistor N3 has a source connected to the first potential VN, a gate connected to the second output terminal 322, and a drain connected to the third output terminal 326.

More precisely, a threshold voltage ($V_{TP5}$) of the fifth PMOS transistor P5 is greater than a threshold voltage ($V_{TP2}$) of the second PMOS transistor P2. In particular, the amplitude of the output signal OUT is equal to the difference between the second potential VP and the threshold voltage $V_{TP2}$ of the second PMOS transistor P2, i.e. VP+$V_{TP2}$. Therefore, considering the source of the fifth PMOS transistor connected to the second potential VP, the threshold voltage $V_{TP5}$ being greater than the threshold voltage $V_{TP2}$ can ensure the fifth PMOS transistor can be successfully turned on by the output voltage VP+$V_{TP2}$, thereby preventing the leakage current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A level shift circuit, comprising:
   a first power supply terminal to which a first potential is supplied;
   a second power supply terminal to which a second potential is supplied, wherein the second potential is lower than the first potential;
   a first PMOS transistor having a source connected to the first power supply terminal, a gate connected to a first input terminal, and a drain connected to a first output terminal;
   a second PMOS transistor having a source connected to the first power supply terminal, a gate connected to a second input terminal, and a drain connected to a second output terminal;
   a third PMOS transistor having a source connected to the first power supply terminal, a gate connected to the second output terminal, and a drain connected to a third output terminal;
   a first NMOS transistor having a drain and a gate connected to the first output terminal;
   a second NMOS transistor having a drain and a gate connected to the second output terminal;
   a third NMOS transistor having a drain connected to a source of the first NMOS transistor, a gate connected to the second output terminal, and a source connected to the second power supply terminal;
   a fourth NMOS transistor having a drain connected to a source of the second NMOS transistor, a gate connected to the first output terminal, and a source connected to the second power supply terminal; and
   a fifth NMOS transistor having a source connected to the second power supply terminal, a gate connected to the second output terminal, and a drain connected to the third output terminal, wherein a threshold voltage of the fifth NMOS transistor is less than a threshold voltage of the second NMOS transistor in an enhancement mode.

2. The level shift circuit as claimed in claim 1, wherein the first input terminal is arranged to input a first input signal, the second input terminal is arranged to input a second input signal, and the second input signal is an inverted signal of the first input signal.

3. The level shift circuit as claimed in claim 1, wherein the first output terminal is arranged to output a first output signal, the second output terminal is arranged to output a second output signal, and the second output signal is an inverted signal of the first output signal.

4. A level shift circuit, comprising:
   a first power supply terminal to which a first potential is supplied;

a second power supply terminal to which a second potential is supplied, wherein the first potential is lower than the second potential;

a first NMOS transistor having a source connected to the first power supply terminal, a gate connected to a first input terminal, and a drain connected to a first output terminal;

a second NMOS transistor having a source connected to the first power supply terminal, a gate connected to a second input terminal, and a drain connected to a second output terminal;

a third NMOS transistor having a source connected to the first potential, a gate connected to the second output terminal, and a drain connected to a third output terminal;

a first PMOS transistor having a drain and a gate connected to the first output terminal;

a second PMOS transistor having a drain and a gate connected to the second output terminal;

a third PMOS transistor having a drain connected to a source of the first PMOS transistor, a gate connected to the second output terminal, and a source connected to the second power supply terminal;

a fourth PMOS transistor having a drain connected to a source of the second PMOS transistor, a gate connected to the first output terminal, and a source connected to the second power supply terminal; and a fifth PMOS transistor having a source connected to the second potential, a gate connected to the second output terminal, and a drain connected to the third output terminal, wherein a threshold voltage of the fifth PMOS transistor is greater than a threshold voltage of the second PMOS transistor in an enhancement mode.

5. The level shift circuit as claimed in claim 4, wherein the first input terminal is arranged to input a first input signal, the second input terminal is arranged to input a second input signal, and the second input signal is an inverted signal of the first input signal.

6. The level shift circuit as claimed in claim 4, wherein the first output terminal is arranged to output a first output signal, the second output terminal is arranged to output a second output signal, and the second output signal is an inverted signal of the first output signal.

* * * * *